(12) United States Patent
Dickey

(10) Patent No.: US 11,632,111 B1
(45) Date of Patent: Apr. 18, 2023

(54) REDUNDANT CONTROL SYSTEM FAULT PROTECTION USING ONLY TWO CONTROLLERS

(71) Applicant: Hamilton Sundstrand Corporation, Charlotte, NC (US)

(72) Inventor: John A. Dickey, Caledonia, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 17/518,029

(22) Filed: Nov. 3, 2021

(51) Int. Cl.
*H03K 19/094* (2006.01)
*H03K 19/003* (2006.01)
*H03K 19/20* (2006.01)

(52) U.S. Cl.
CPC ....... *H03K 19/00392* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 4,887,214 A * | 12/1989 | Takats | G05D 1/0077 318/564 |
| 5,274,554 A | 12/1993 | Takats et al. | |
| 5,745,539 A | 4/1998 | Lang | |
| 10,229,016 B2 | 3/2019 | Freydel et al. | |
| 2007/0075743 A1* | 4/2007 | Oh | H03K 19/0016 326/83 |
| 2015/0039799 A1* | 2/2015 | Zhu | G06F 9/4405 710/301 |
| 2018/0138864 A1* | 5/2018 | Grede | H01J 37/32174 |
| 2022/0200263 A1* | 6/2022 | Molenaar | H02H 3/16 |

* cited by examiner

*Primary Examiner* — Kurtis R Bahr
(74) *Attorney, Agent, or Firm* — Locke Lord LLP; Joshua L. Jones; Gabrielle L. Gelozin

(57) ABSTRACT

A control system is provides that includes a logic gate generating an output state signal, and first and second redundant controllers, wherein the first controller is configured to output a first state signal to a first input of the logic gate, and the second controller is configured to output a second state signal to a second input of the logic gate, and wherein the first controller is configured to receive an impedance isolated feedback signal corresponding to the second state signal from the second controller, and the second controller is configured to receive an impedance isolated feedback signal corresponding to the first state signal from the first controller, so that each controller can determine whether both inputs to the logic gate match one another.

15 Claims, 2 Drawing Sheets

REDUNDANT CONTROL SYSTEM FAULT PROTECTION USING ONLY TWO CONTROLLERS

BACKGROUND OF THE DISCLOSURE

1. Field of the Disclosure

The subject disclosure is directed to a redundant control system, and more particularly to a fault protection scheme for a control system that uses only two controllers to provide nearly the same benefit of a three controller system.

2. Description of Related Art

Many control systems for critical applications require some level of redundancy for fault protection so that if a component fails, other system components can detect the failure and in many cases utilize copies of the failed circuit or other portions of the system to take over the same or similar functionality of the failed component(s). With this kind of protection, the system can be configured to continue to perform at least a critical subset of its needed functions.

To protect critical functions in this way, several prerequisites are needed. The system must be able to detect any failures of functions that need to be maintained during a component fault. The system must have separate and additional circuits that can perform the critical functions. The system must be able to block or isolate the failed components from the control output functions that need to continue so that a 'stuck-at' fault cannot lock the output of the function into an undesired state. Otherwise, the system must be able to compensate for that error if it can't block or isolate the failed component.

The system must also be able to link the functional backup circuits into the path of the normal functions, so that needed inputs can be accepted from other circuits and systems to enable the function to continue to make decisions. Only a valid backup signal should be allowed to intervene with the output signal and the system must be able to block or ignore a backup signal that is faulted, as in some cases the backup signal may be the failed signal and the operating signal may be the one that is correct.

The system should be able to detect a failure in its backup circuits before or during operational use, so that a failed backup does not incorrectly take over functional control when it is not working correctly. The system should also be able to report any faults detected and whether the backup circuits have taken control.

In the past, there have been a number of ways to implement these type of redundant protective functions, each with its own level of fault tolerance and percent of functional redundancy. From basic coding logic theory, it is known that two pieces of information must be compared to determine if there has been an error, but with only two, a determination cannot be made as to which of the two pieces of information is correct. Therefore, it takes a third piece of information to 'vote' and select the correct action for the function.

In the past, then, basic redundant operation has typically required normally three independent circuits to vote on what a function should be doing and to assure that a failed circuit cannot interfere with the remaining working circuits. Since many functions need 'high availability' or partial redundancy, there is also a method of using two independent circuits to create what is referred to as a 'Fail Passive' system.

Most 'Fail Passive' systems include things like watchdog timers and/or cross channel communications checking to determine if a controller is failed and not if the actual control signal is wrong. In these cases, the controller gets locked out of control regardless of whether the actual output control signal is correct or wrong. Typically, watchdog timer monitors and cross controller channel communications regularly pass a 'token' or message back and forth to confirm they are actively working.

This kind of system cannot assure that all faults are corrected by a voting system, but it can assure that a failed circuit can be 'locked out' of control, so that no hazardous conditions result from the failed circuit going rogue. This allows just two circuits to provide full redundancy for many failures. For example, where the original fault is passive and not acting to interfere with the redundant circuit, and providing 'failsafe' states for others where the fault on one circuit could interfere with the operation of the backup circuit.

SUMMARY OF THE DISCLOSURE

The subject disclosure is directed to a new and useful control system including a logic gate that generates an output state signal, and first and second redundant controllers. The logic gate can be configured as an Exclusive OR function (XOR) or it can be configured as an Exclusive NOR function (XNOR).

The first controller is configured to output a first state signal to a first input of the logic gate, and the second controller is configured to output a second state signal to a second input of the logic gate. The first controller is also configured to receive an impedance isolated feedback signal corresponding to the second state signal from the second controller, and the second controller is also configured to receive an impedance isolated feedback signal corresponding to the first state signal from the first controller.

More particularly, a first medium value resistor isolates the first controller from a fault related to the second controller, and a second medium value resistor isolates the second controller from a fault related to the first controller. Preferably, the value of the resistor should be low enough to ensure a valid logic level at the input to the controller and high enough so that a fault on the input to the controller (one that would short that input to one rail or another) will not be able to force enough current through the resistor to change the logic state of the source signal that the cross side controller is also monitoring. Without the resistor, a short on the second controller input would also change the state reading that the first controller receives. Typical values for these resistors may range from 1 Kohm up to 100 Kohm.

As a result of this configuration, each controller can determine whether both inputs to the logic gate match one another. And, because of the impedance protection on the feedback lines, if a fault occurs with respect to one controller, it cannot influence the output state of the other controller.

Preferably, a monitor determines whether the output state of the logic gate matches the respective output states of the first and second controllers. If the respective output states of the first and second controllers match one another and are not faulted, then the monitor will determine that the output state of the logic gate is correct. If the respective output states of the first and second controllers match one another and are faulted, then the monitor will determine that the output state of the logic gate may not be correct.

Moreover, if the first and second controllers are both faulted, they won't be able to determine they are in that condition, since the output states match. Thus, a double fault is not covered by this or most redundant backup systems. This system, like many others only covers single faults. With one controller faulted and the other un-faulted, the output states will not match and that is how the valid controller knows to force the corrected state. If the invalid controller (faulted controller) could, it would try to force a faulted state again after the un-faulted controller corrects the output state, except for the situation where only 'stuck' faults are covered. With the fault 'stuck' from the failed controller, it cannot change its own control state after the cross-side valid controller corrects the output. Consequently, the two cannot fight each other for correct and failed output control.

In accordance with this disclosure, if the respective output states of the first and second controllers do not match one another, then each controller will try to drive the logic gate output to a state that results in the logic gate output matching that controller's assessment of what the logic gate output state should be. The unmatched output states result from one of the first and second controllers being in a faulted condition, whereby the other one of the first and second controllers being in a working condition can drive the logic gate output to a corrected logic state.

Preferably, the first controller includes a first logic function for correcting the output state of the first controller to drive the logic gate output to a corrected logic state, if the second controller is in a faulted condition. Similarly, the second controller includes a second logic function for correcting the output state of the second controller to drive the output of the logic gate output to a corrected logic state, if the first controller is in a faulted condition.

It is envisioned that the first and second redundant controllers can be configured to receive an additional impedance isolated feedback signal from the logic gate, which would correspond to the output state generated by the logic gate to confirm the logic gate is in a working condition. In such a configuration, a monitor would determine whether the output state of the logic gate matches the corrected logic state.

The logic gate feedback signal can be a used as a built in test, but the system cannot correct the output of the logic gate if the logic gate itself is what is at fault. Importantly, a failed logic gate can only impact that one signal, thereby maintaining a single faulted channel from a single fault. There is no way for the failed logic gate to affect any other channel.

These and other features of the control system described herein will become more readily apparent to those having ordinary skill in the art to which the subject disclosure appertains from the detailed description of the preferred embodiments taken in conjunction with the following brief description of the drawings.

BRIEF DESCRIPTION OF THE DRAWINGS

So that those skilled in the art will readily understand how to make and use the control system of the subject invention without undue experimentation, preferred embodiments thereof will be described in detail herein below with reference to the figures wherein.

DETAILED DESCRIPTION OF THE EMBODIMENTS

Figure 1:
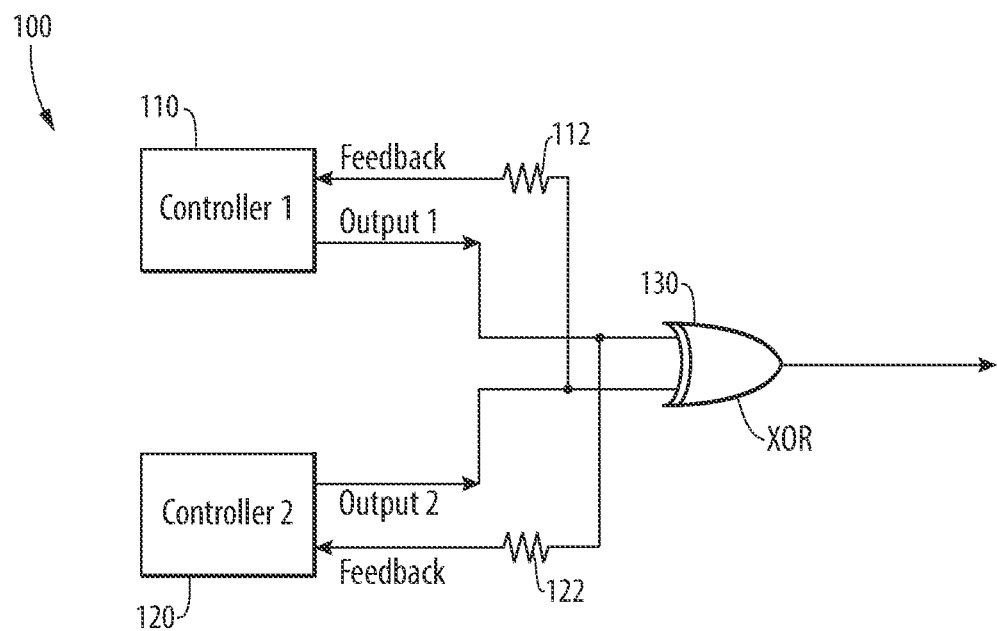
FIG. 1 is a schematic representation of an embodiment of the control system of the subject disclosure, which includes a logic gate in the form of an Exclusive OR function; subject.

Referring now to the drawings wherein like reference numerals identify similar features, there is illustrated in FIG. 1 a control system configured in accordance with an embodiment of the subject disclosure and designated generally by reference numeral 100 The control system 100 includes a logic gate 130 that generates an output state signal, and first and second redundant controllers 110 and 120.

In this embodiment, the logic gate 130 is an Exclusive OR function (XOR). Thus, for two given logical inputs to the logic gate 130, the XOR function will return TRUE if only one of the logic inputs is true and FALSE if both logic inputs are true or both logic inputs are false. If neither logic input is true, the logic gate 130 will also return FALSE.

Figure 2:
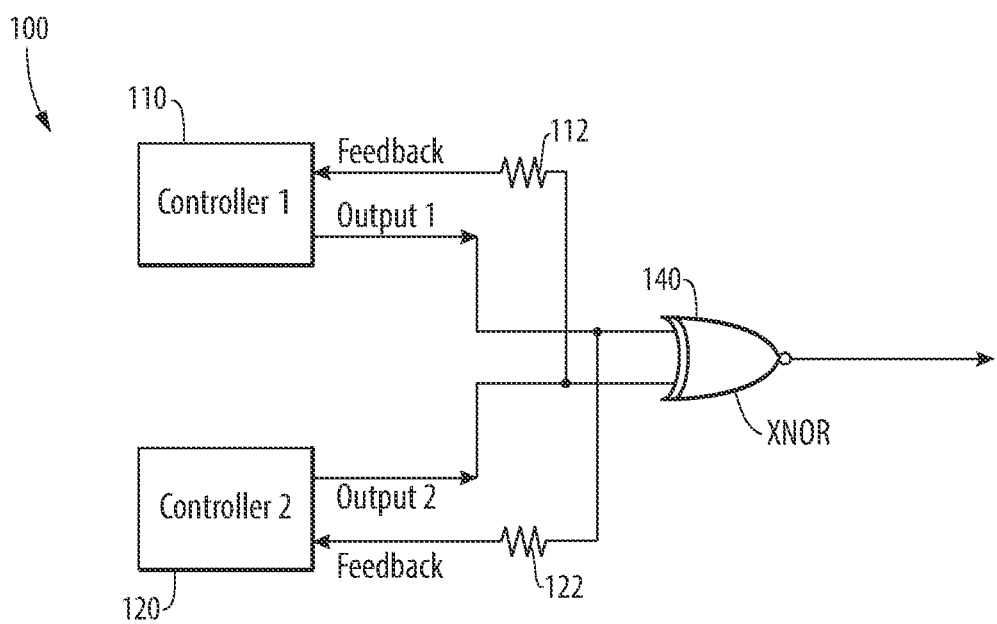
FIG. 2 is a schematic representation of a control system shown in FIG. 1, wherein the controllers include logic functions for correcting the output of the controller, if necessary, to drive the logic gate output to a corrected logic state.

In an alternate embodiment shown in FIG. 2, the logic gate, which is designated by reference numeral 140, is an Exclusive NOR function (XNOR), which is the logical complement of the XOR gate 130. This results in the output inversion of the state that the XOR gate would have generated.

Referring back to FIG. 1, the first controller 110 is configured to output a first state signal to a first input of the logic gate 130, and the second controller 120 is configured to output a second state signal to a second input of the logic gate 130. The first controller 110 is also configured to receive an impedance isolated feedback signal corresponding to the second state signal from the second controller 120, and the second controller 120 is also configured to receive an impedance isolated feedback signal corresponding to the first state signal from the first controller 110.

More particularly, a first medium value resistor 112 isolates the first controller 110 from a fault related to the second controller 120, and a second medium value resistor 122 isolates the second controller 120 from a fault related to the first controller 110. The impedance value of each resistor 112, 122 should be low enough to ensure a valid logic level at the input to the respective controller 110, 120 and high enough so that a fault on the input to the controller will not be able to force enough current through the resistor to change the logic state of the source signal that the cross side controller is also monitoring. For example, without the resistor 112, a short on the second controller 120 would change the state reading that the first controller 110 receives. Typical impedance values for the resistors 112, 122 may range from 1 kΩ up to 100 kΩ As a result of this configuration, each controller 110, 120 can determine whether both inputs to the logic gate 130 match one another. And, because of the impedance protection on the feedback lines, if a fault occurs with respect to one controller, it cannot influence the output state of the other controller.

Preferably, a monitor determines whether the output state of the logic gate 130 matches the respective output states of the first and second controllers 110, 120. If the respective output states of the first and second controllers 110, 120 match one another and are not faulted, then the monitor will determine that the output state of the logic gate is correct. If the respective output states of the first and second controllers 110, 120 match one another and are faulted, then the monitor will determine that the output state of the logic gate 130 may not be correct.

However, if the respective output states of the first and second controllers 110, 120 do not match one another, then each controller 110, 120 will try to drive the logic gate output to a state that results in the logic gate output matching that controller's assessment of what the logic gate output state should be. The unmatched output states result from one of the first and second controllers 110, 120 being in a faulted condition, whereby the other one of the first and second controllers being in a working condition can drive the logic gate output to a corrected logic state.

If the respective output states of the first and second controllers 110, 120 do not match then one controller is faulted and likely will not attempt to change its output. That allows the un-faulted controller to toggle its output, thereby correcting the control state output of the logic gate 130. If the faulted controller tries to change its output state for some reason, then there will likely be the condition of a 'babbling node' which will continuously toggle the controller output sign on and off.

Figure 3:
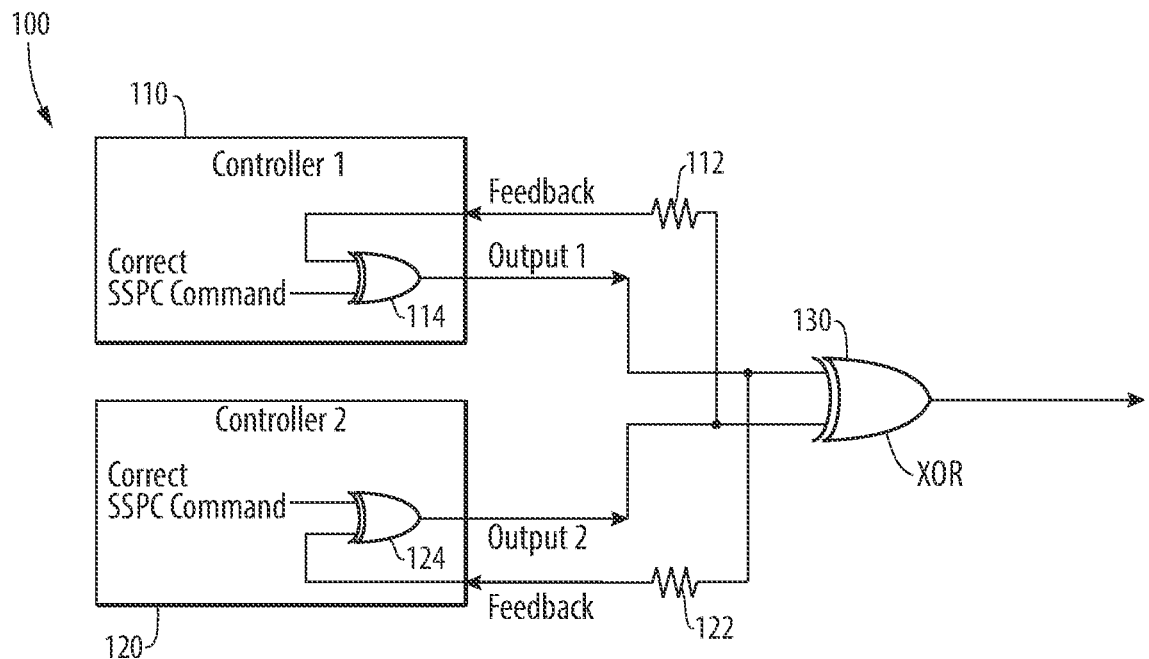
FIG. 3 is a schematic representation of an embodiment of the control system of the subject disclosure, which includes a logic gate in the form of an Exclusive NOR function.

Referring now to FIG. 3, there is illustrated a schematic representation of the control system shown in FIG. 1, wherein controller 110 includes a logic function 114 for correcting the output of controller 110 to drive the output of the logic gate 130 to a corrected logic state, if the second controller 120 is in a faulted condition. Similarly, controller 120 includes a logic function 124 for correcting the output of controller 120 to drive the output of the logic gate 130 to a corrected logic state, if the first controller 110 is in a faulted condition.

In this regard, the logic function 114 of controller 110 receives the impedance isolated feedback signal corresponding to the second state signal from the second controller 120, and, if needed, a correct Solid State Power Control (SSPC) command signal. Similarly, the logic function 124 of controller 120 receives the impedance isolated feedback signal corresponding to the first state signal from the first controller 110, and if needed, a correct SSPC command signal.

Figure 4:
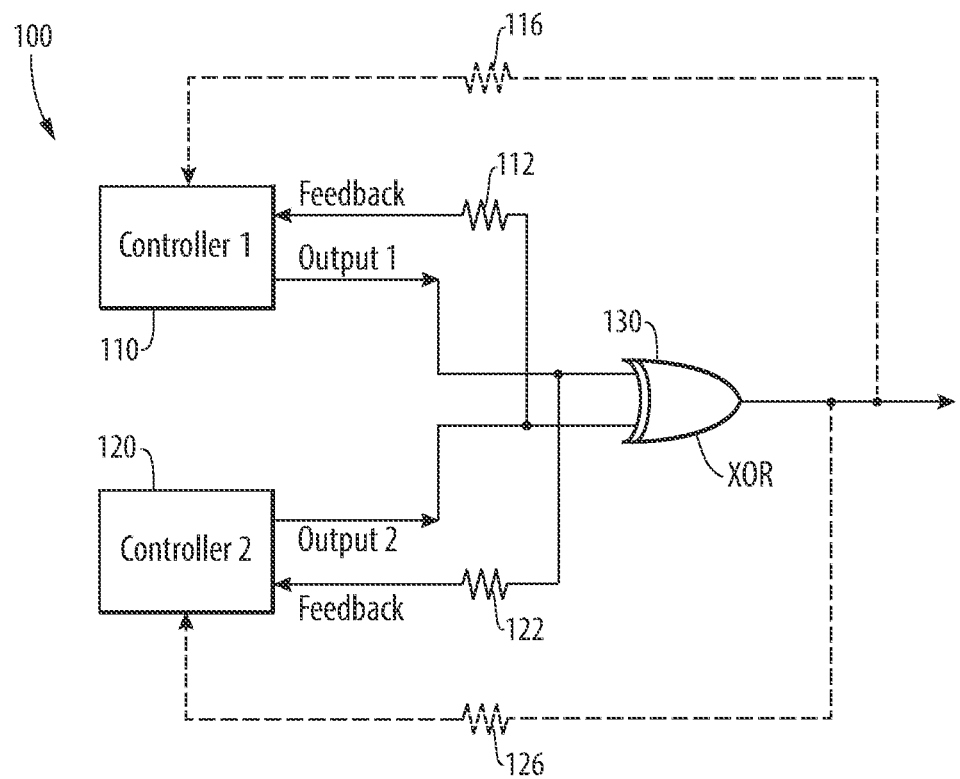
FIG. 4 is a schematic representation of an alternate embodiment of the control system shown in FIG. 1, which includes a feedback loop from the logic gate output to the redundant controllers, to enable the controllers to confirm the logic gate is working.

Referring to FIG. 4, it is envisioned that the first and second redundant controllers 110, 120 can be configured to receive an additional impedance isolated feedback signal from the logic gate 130, which would correspond to the output state generated by the logic gate 130, in order to confirm the logic gate 130 is in a working condition. In such a configuration, the system would be adapted and configured to determine whether the output state of the logic gate 130 matches the corrected logic state. Here, a resistor 116 isolates the first controller 110 from a fault in the control system, and a second resistor 126 isolates the second controller 120 from a fault in the control system.

It should be understood that while these optional resistors 116, 126 can be used to detect a fault from logic gate 130, the logic gate error cannot be corrected if the logic gate itself is the source of the fault. In other words, the faulted logic gate will simply ignore input changes and continue to output the wrong value in most instances.

In sum, the control system of the subject disclosure uses only two controller functions in a 'fail passive' protection arrangement. It thereby provides improvement in the percentage and type of faults that can be overcome by redundant logic in the case where the failed component has failed in such a state as to try to force the functional output to the wrong state, thus allowing the backup circuit to force the correct state anyway. There is still the possibility that the backup circuit is actually the one that is not correct, but here each functional circuit has some level of internal monitoring so that it at least appears to be operational.

In other words, the only fault that may not be corrected by this circuit is the case where the two controllers continually keep fighting each other over what the output state of the logic gate should be. Although the logic gate itself can be faulted, as described above, it will only affect that one channel, so that all the other channels controlled by the two controllers are unaffected by a logic gate fault.

In the subject control system, each redundant controller receives its own protected copy of the status of the output of the logic gate, so that it knows whether the output of the logic gate matches the output state each controller thinks should be active. This feedback is impedance isolated with a simple medium value resistor, because if the input to one of the controllers from this feedback happens to be shorted to ground or power, then the resistance must be high enough so that the logic gate output can still provide the correct logic level, even while driving the current that will be flowing through that isolation resistor. In this way, a fault on either controller's input line cannot provide enough current through the isolation resistors to influence the output state of the logic gate. And, no matter what happens to the input line on one controller, it cannot influence the input monitor state of the other controller.

In this system configuration, if both controllers agree and are not faulted then the logic gate output is correct. If both controllers agree and are faulted then the logic gate output may be wrong. This is a double fault scenario that is not handled by the system of the subject disclosure. The system disclosed herein is used to identify and correct single point faults only.

If the controllers disagree then they will each try to drive the input to the logic gate to the state that results in the output matching that controller's assessment of what the output state should be. This is made possible and implemented by the fact that an output from an XOR or XNOR gate can be forced into either state, regardless of what the state is on the other input. This is true any time the other input is static.

Thus, any static fault from a single controller can be corrected by the other controller regardless of the state in which the output of the faulted controller is stuck. For most normal logic using AND or OR gates, a faulted signal can block the other control signal in at least 1 of 4 possible combinational conditions. However, in the subject control system, with an XOR or XNOR gate being used to combine the controller outputs, all static states can be correct.

If the fault happens to be a continuously toggling output from the other controller making the output of the logic gate continuously toggle, then this fault will probably not be correctable as even if the other controller can toggle at the same rate to whatever state is needed, there will always be a delay resulting in the output changing state continuously.

This protection method allows only two controllers to provide almost the same benefit as in a three controller voting case, except for certain cases: a) in the case where both controllers are failed, the output may be wrong but even the three controller voting system cannot correct two errors; and b) in the case where a faulted controller is continuously toggling, the working controller will not be able to completely block it or correct the output. In the unusual case that both controllers are correctly working but don't agree, they will fight each other to try to make the output match the state in which they believe it should be.

The control system of the subject disclosure thus provides most of the capability of a three controller voting system with only two controllers and very simple and reliable coordination logic, making this system very robust as well as smaller and lower cost than a three controller system or other similar approaches including error correction coding methods.

While the subject disclosure has been shown and described with reference to preferred embodiments, those skilled in the art will readily appreciate that changes and/or modifications may be made thereto without departing from the scope of the subject disclosure.

What is claimed is:

1. A control system comprising:
   a) a logic gate that generates an output state signal; and
   b) first and second redundant controllers,
      wherein the first controller is configured to output a first state signal to a first input of the logic gate, and the second controller is configured to output a second state signal to a second input of the logic gate, and
      wherein the first controller is configured to receive an impedance isolated feedback signal corresponding to the second state signal from the second controller, and the second controller is configured to receive an impedance isolated feedback signal corresponding to the first state signal from the first controller, so that each controller can determine whether both inputs to the logic gate match one another.

2. A control system as recited in claim 1, wherein the logic gate is an Exclusive OR function.

3. A control system as recited in claim 1, wherein the logic gate is an Exclusive NOR function.

4. A control system as recited in claim 1, wherein a first resistor isolates the first controller from a fault related to the second controller.

5. A control system as recited in claim 4, wherein a second resistor isolates the second controller from a fault related to the first controller.

6. A control system as recited in claim 5, wherein the first and second resistors have impedance values ranging from 1 Kohm up to 100 Kohm.

7. A control system as recited in claim 1, wherein a monitor determines whether the output state of the logic gate matches the respective output states of the first and second controllers.

8. A control system as recited in claim 7, wherein if the respective output states of the first and second controllers match one another and are not faulted the monitor will determine that the output state of the logic gate is correct.

9. A control system as recited in claim 7, wherein if the respective output states of the first and second controllers match one another and are faulted the monitor will determine that the output state of the logic gate may not be correct.

10. A control system as recited in claim 7, wherein if the respective output states of the first and second controllers do not match one another then each controller will try to drive the logic gate output to a state that results in the logic gate output matching that controller's assessment of what the logic gate output state should be.

11. A control system as recited in claim 10, wherein the unmatched output states result from one of the first and second controllers being in a faulted condition, whereby the other one of the first and second controllers being in a working condition can drive the logic gate output to a corrected logic state.

12. A control system as recited in claim 11, wherein the first controller includes a first logic function for correcting the output state of the first controller to drive the logic gate output to a corrected logic state, if the second controller is in a faulted condition.

13. A control system as recited in claim 11, wherein the second controller includes a second logic function for correcting the output state of the second controller to drive the output of the logic gate output to a corrected logic state, if the first controller is in a faulted condition.

14. A control system as recited in claim 11, wherein the first and second redundant controllers are each configured to receive an additional impedance isolated feedback signal from the logic gate corresponding to the output state generated by the logic gate to confirm the logic gate is in a working condition.

15. A control system as recited in claim 14, further comprising means for determining whether the output state of the logic gate matches the corrected logic state.

* * * * *